United States Patent [19]

Walker et al.

[11] Patent Number: 4,868,059

[45] Date of Patent: Sep. 19, 1989

[54] CURABLE COMPOSITION CONTAINING A DIFUNCTIONAL EPOXY RESIN, A POLYFUNCTIONAL EPOXY RESIN, A DIFUNCTIONAL PHENOL AND A POLYFUNCTIONAL PHENOL

[75] Inventors: Louis L. Walker, Clute; Paul A. Larson, Lake Jackson, both of Tex.

[73] Assignee: The Dow Chemical Company, Midland, Mich.

[21] Appl. No.: 121,329

[22] Filed: Nov. 16, 1987

[51] Int. Cl.$^4$ ............................................. C08G 59/62
[52] U.S. Cl. ..................... 428/416; 428/418; 525/482; 528/88; 528/89; 528/90; 528/91; 528/93; 528/94; 528/98; 528/99; 528/102; 528/103
[58] Field of Search ............... 525/482; 528/88, 89, 528/90, 91, 93, 94, 98, 99, 102, 103; 428/416, 418

[56] References Cited

U.S. PATENT DOCUMENTS

| | | | |
|---|---|---|---|
| 3,493,630 | 2/1970 | Salensky | 260/831 |
| 3,738,862 | 6/1973 | Klarquist et al. | 117/126 GE |
| 3,931,109 | 1/1976 | Martin | 260/47 EP |
| 4,186,036 | 1/1980 | Elms et al. | 528/103 |
| 4,322,456 | 3/1982 | Martin | 427/195 |
| 4,440,914 | 4/1984 | Helfand et al. | 525/482 |
| 4,549,000 | 10/1985 | Widmer et al. | 528/103 |
| 4,604,317 | 8/1986 | Berman et al. | 428/285 |

FOREIGN PATENT DOCUMENTS

| | | | |
|---|---|---|---|
| 0019322 | 2/1983 | Japan | 525/482 |
| 1148226 | 1/1986 | Japan | 525/482 |
| 1148228 | 1/1986 | Japan | 528/103 |
| 1246228 | 11/1986 | Japan | 525/482 |

OTHER PUBLICATIONS

Agreement dated 7-2-86 with IBM.

*Primary Examiner*—John Kight
*Assistant Examiner*—Frederick Krass

[57] ABSTRACT

Electrical laminates are prepared from prepreg materials prepared by impregnating a substrate with a laminating varnish comprising a solvent solution of a curable composition comprising (A) a mixture of at least one epoxy resin having an average of more than 1 but not more than 2 vicinal epoxy groups per molecule and at least one epoxy resin having an average of more than 2 vicinal epoxy groups per molecule; (B) a mixture of at least one phenolic hydroxyl-containing compound having an average of more than 1 but not more than 2 phenolic hydroxyl groups per molecule and at least one phenolic hydroxyl-containing compound having an average of more than 2 phenolic hydroxyl groups per molecule; and (C) at least one catalyst for effecting the reaction between (A) and (B).

14 Claims, No Drawings

CURABLE COMPOSITION CONTAINING A DIFUNCTIONAL EPOXY RESIN, A POLYFUNCTIONAL EPOXY RESIN, A DIFUNCTIONAL PHENOL AND A POLYFUNCTIONAL PHENOL

FIELD OF THE INVENTION

The present invention concerns curable compositions containing difunctional epoxy resins, polyfunctional epoxy resins difunctional phenols and polyfunctional phenols as well as cured products thereof.

BACKGROUND OF THE INVENTION

Electrical laminates are usually prepared from bisphenol A based epoxy resins advanced with tetrabromobisphenol A and cured with a biguanide such as dicyandiamide. These electrical laminates are adequate for applications wherein the Tg requirement of the resin from which the laminates are prepared are below about 135° C. and the moisture absorbance of the laminate is greater than 1% by weight. However, in some applications, it would be desirable to have electrical laminates prepared from resin systems which when cured have glass transition temperatures above about 135° C., particularly above about 150° C. and which laminates have moisture absorbance below about 1% by weight.

SUMMARY OF THE INVENTION

One aspect of the present invention pertains to a composition which comprises (A) an epoxy-containing component consisting essentially of
  (1) from about 5 to about 95 percent by weight of at least one epoxy resin having an average of more than 1 but not more than 2 vicinal epoxide groups per molecule; and
  (2) from about 95 to about 5 percent by weight of at least one epoxy resin having an average of more than 2 vicinal epoxide groups per molecule; and (B) a phenolic hydroxyl-containing component consisting essentially of
  (1) from about 10 to about 70 equivalent percent of at least one phenolic hydroxyl-containing compound having an average of more than 1 but not more than 2 phenolic hydroxyl groups per molecule: and
  (2) from about 90 to about 30 equivalent percent of at least one phenolic hydroxyl-containing compound having an average of more than 2 phenolic hydroxyl groups per molecule; and wherein components (A) and (B) are present in quantities which provide a ratio of phenolic hydroxyl groups for each epoxy group of from about 0.75:1 to about 1.2:1.

Another aspect of the present invention pertains to a curable composition which comprises (A) an epoxy-containing component consisting essentially of
  (1) from about 5 to about 95 percent by weight of at least one epoxy resin having an average of more than 1 but not more than 2 vicinal epoxide groups per molecule; and
  (2) from about 95 to about 5 percent by weight of at least one epoxy resin having an average of more than 2 vicinal epoxide groups per molecule;

(B) a phenolic hydroxyl-containing component consisting essentially of
  (1) from about 10 to about 70 equivalent percent of at least one phenolic hydroxyl-containing compound having an average of more than 1 but not more than 2 phenolic hydroxyl groups per molecule; and
  (2) from about 90 to about 30 equivalent percent of at least one phenolic hydroxyl-containing compound having an average of more than 2 phenolic hydroxyl groups per molecule; and (C) a catalytic quantity of at least one catalyst for effecting the reaction between components (A) and (B); and wherein components (A) and (B) are present in quantities which provide a ratio of phenolic hydroxyl groups for each epoxy group of from about 0.75:1 to about 1.2:1.

A further aspect of the present invention pertains to a laminating varnish composition comprising (A) an epoxy-containing composition consisting essentially of
  (1) from about 5 to about 95 percent by weight of at least one epoxy resin having an average of more than 1 but not more than 2 vicinal epoxide groups per molecule; and
  (2) from about 95 to about 5 percent by weight of at least one epoxy resin having an average of more than 2 vicinal epoxide groups per molecule;

(B) a phenolic hydroxyl-containing composition consisting essentially of
  (1) from about 10 to about 70 equivalent percent of at least one phenolic hydroxyl-containing compound having an average of more than 1 but not more than 2 phenolic hydroxyl groups per molecule; and
  (2) from about 90 to about 30 equivalent percent of at least one phenolic hydroxyl-containing compound having an average of more than 2 phenolic hydroxyl groups per molecule; and (C) a catalytic quantity of at least one catalyst for effecting the reaction between components (A) and (B); and optionally (D) one or more solvents in an amount of from about zero to about 75 percent by weight of the total composition; and wherein components (A) and (B) are present in quantities which provide a ratio of phenolic hydroxyl groups for each epoxy group of from about 0.75:1 to about 1.2:1.

Another aspect of the present invention pertains to a laminate resulting from curing one or more plies of of a substrate material which has been impregnated with the aforementioned laminating varnish.

The curable compositions described above when cured have glass transition, Tg, temperatures above about 135° C., usually above about 150° C. The laminates described above prepared from these curable compositions absorb moisture to an extent of less than about 1 percent by weight.

DETAILED DESCRIPTION OF THE INVENTION

The epoxy resin compositions can be prepared by blending the components together in any suitable manner such as, for example, mixing the two epoxy resins together in a solvent at elevated temperatures to form a uniform mixture, then cooling to room temperature and blending in the two phenolic compounds to form a uniform mixture.

The epoxy resin mixture can suitably contain from about 5 to about 95, more suitably from about 5 to about 60, most suitably from about 5 to about 40 percent by weight of the not greater than 2-functional epoxy resin based upon the combined weight of the not greater than 2-functional epoxy resin and the greater than 2-functional epoxy resin. Correspondingly, the greater than 2-functional epoxy resin is suitably employed in an amount of from about 95 to about 5, more suitably from about 95 to about 40, most suitably from about 95 to about 60 percent by weight of the greater than 2-functional epoxy resin based upon the combined weight of the not greater than 2-functional epoxy resin and the greater than 2-functional epoxy resin.

Any epoxy resin having an average of more than one but not greater than two vicinal epoxy groups per molecule can be employed herein. Suitable such epoxy resins include, for example, those diglycidyl ethers of dihydric phenols represented by the formulas I and II

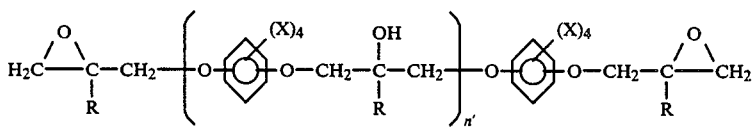

FORMULA I

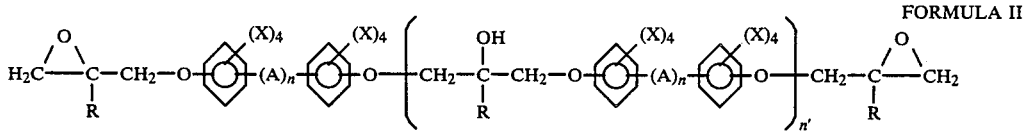

FORMULA II wherein each A is independently a divalent hydrocarbyl group having suitably from 1 to about 10, more suitably from 1 to about 5, most suitably from 1 to about 3, carbon atoms, —S—, —S—S—, —SO—, —SO$_2$—, —CO—, or —O—; each R is independently hydrogen or an alkyl group having from 1 to about 3 carbon atoms: each X is independently hydrogen, an alkyl group having suitably from 1 to about 10, more suitably from 1 to about 5, most suitably from 1 to about 3, carbon atoms or a halogen, preferably chlorine or bromine: each n independently has a value of zero or 1; and n' has a value suitably from zero to about 10, more suitably from zero to about 2, most suitably from zero to about 0.5.

Particularly suitable epoxy resins having an average of more than 1 but not more than 2 vicinal epoxy groups per molecule include, for example, the diglycidyl ethers of bisphenol A, tetrabromobisphenol A where the bromine atoms are in the ortho or meta positions relative to the ether oxygen atoms, bisphenol K, bisphenol F, bisphenol S, mixtures thereof and the like.

Suitable epoxy resins having an average of more than 2 vicinal epoxy groups per molecule include, for example, those represented by the formulas III and IV

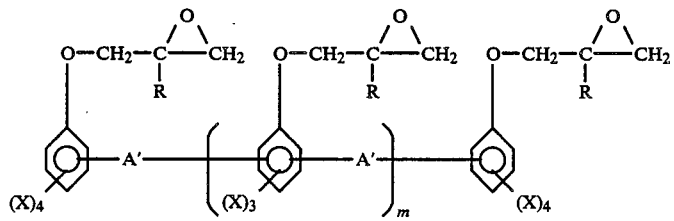

FORMULA III

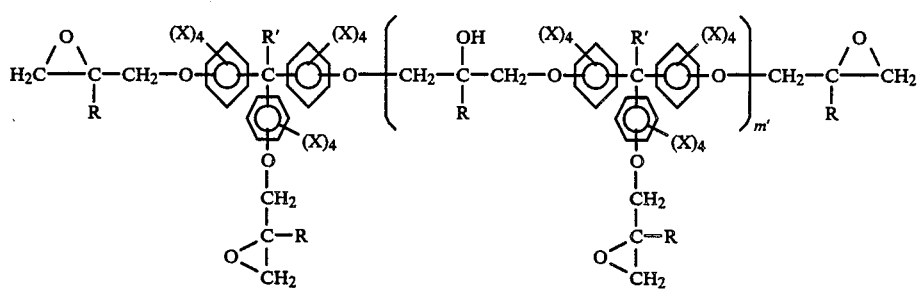

FORMULA IV wherein each R and X is as described above: each A' is independently a divalent hydrocarbyl group suitably having from 1 to about 10, more suitably from 1 to about 4, most suitably from 1 to about 2, carbon atoms nor a divalent polycyclopentadiene group; each R' is independently hydrogen or a hydrocarbyl group having suitably from 1 to about 10, more suitably from 1 to about 5, most suitably from 1 to about 2, carbon atoms; m suitably has a value from about 0.1 to about 7, more suitably from about 1 to about 5, most suitably from about 1 to about 4; and m' suitably has a value from zero to about 3, more suitably from zero to about 2, most suitably from zero to about 1.

The phenolic hydroxyl-containing component suitably contains from about 10 to about 70, more suitably from about 10 to about 50, most suitably from about 10 to about 35, equivalent percent phenolic hydroxyl-containing compound having an average of more than 1 but not more than 2 phenolic hydroxyl groups per molecule based upon the combined weight of phenolic hydroxyl-containing compound having an average of not more than 2 phenolic hydroxyl groups per molecule and phenolic hydroxyl-containing compound having an average of more than 2 phenolic hydroxyl groups per molecule. Correspondingly, the phenolic hydroxyl-containing component suitably contains from about 90 to about 30, more suitably from about 90 to about 50, most suitably from about 90 to about 65, equivalent percent phenolic hydroxyl-containing compound having an average of more than 2 phenolic hydroxyl groups per molecule based upon the combined weight of phenolic hydroxyl-containing compound having an average of not more than 2 phenolic hydroxyl groups per molecule and phenolic hydroxyl-containing compound having an average of more than 2 phenolic hydroxyl groups per molecule.

Among the compounds which are suitable as the phenolic hydroxyl-containing compound having an average of more than 1 but not more than 2 phenolic hydroxyl groups per molecule include, for example, those represented by the following formulas V and VI

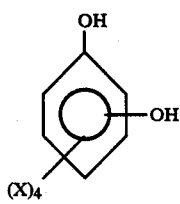

FORMULA V

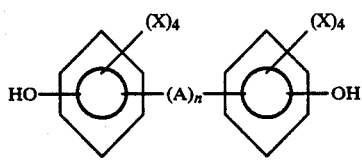

FORMULA VI wherein A, X and n are as previously defined. phenolic hydroxyl-containing compounds having an average of more than 1 but not more than 2 phenolic hydroxyl groups per molecule include, for example, bisphenol A, bisphenol K, bisphenol F, bisphenol S, the halogenated, particularly the brominated, derivatives of the aforementioned bisphenols wherein the halogen atoms are either ortho or meta with respect to the ether oxygen atoms, resorcinol, catechol, hydroquinone, tetramethylbisphenol A, 4,4'-dihydroxybiphenyl, 3,5,3'5'-tetramethyl-4,4'-dihydroxybiphenyl, 3,5,3'5'-tetrabromodihydroxybiphenyl, 3,5,3'5'-tetramethyl-2,6,2',6'-tetrabromo-4,4'-dihydroxybiphenyl, any combination thereof and the like.

Among the compounds which are suitable as the phenolic hydroxyl-containing component having an average of more than 2 phenolic hydroxyl groups per molecule include, for example, those represented by the following formulas VII and VIII

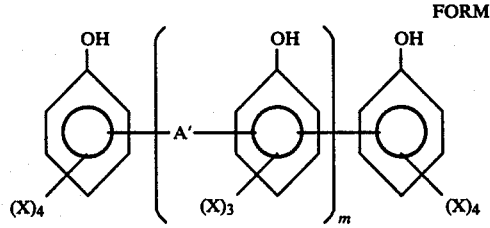

FORMULA VII

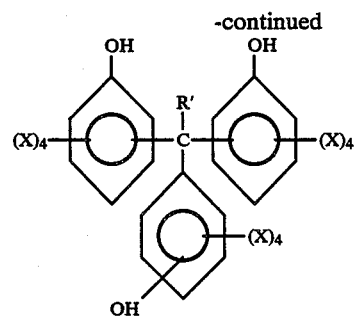

FORMULA VIII wherein A', R', X and m are as previously defined. Particularly suitable phenolic hydroxyl-containing compounds having an average of more than 2 phenolic hydroxyl groups per molecule include, for example, the phenol-formaldehyde novolac resins, cresol-formaldehyde novolac resins, brominated phenol-formaldehyde novolac resins, brominated cresol-formaldehyde novolac resins, 3,3',5,5'-tetramethyl-(1,1',-biphenyl)-2,4,4'-triol, pyrogallol, any combination thereof and the like.

The term hydrocarbyl as employed herein means any aliphatic, cycloaliphatic, aromatic, aryl substituted aliphatic or cycloaliphatic, or aliphatic or cycloaliphatic substituted aromatic groups.

The epoxy-containing component and the phenolic hydroxyl-containing component are employed in quantities which provide a phenolic hydroxyl group to epoxy group ratio suitably of from about 0.75:1 to about 1.2:1, more suitably from about 0.85:1 to about 1:1, most suitably from about 0.95:1 to about 1:1.

Suitable catalysts for effecting the reaction between the epoxy resin and the phenolic hydroxyl-containing compound include, for example, those disclosed in U.S. Pat. Nos. 3,306,872; 3,341,580; 3,379,684; 3,477,990; 3,547,881; 3,637,590; 3,843,605; 3,948,855; 3,956,237; 4,048,141; 4,093,650; 4,131,633; 4,132,706; 4,171,420; 4,177,216; 4,302,574; 4,320,222; 4,358,578; 4,366,295; and 4,389,520, all of which are incorporated herein by reference.

Particularly suitable catalysts are those quaternary phosphonium and ammonium compounds such as, for example, ethyltriphenylphosphonium chloride, ethyltriphenylphosphonium bromide, ethyltriphenylphosphonium iodide, ethyltriphenylphosphonium acetate, ethyltriphenylphosphonium diacetate (ethyltriphenylphosphonium acetate acetic acid complex), ethyltriphenylphosphonium tetrahaloborate, tetrabutylphosphonium chloride, tetrabutylphosphonium bromide, tetrabutylphosphonium iodide, tetrabutylphosphonium acetate, tetrabutylphosphonium diacetate (tetrabutylphosphonium acetate acetic acid complex), tetrabutylphosphonium tetrahaloborate, butyltriphenylphosphonium tetrabromobisphenate, butyltriphenylphosphonium bisphenate, butyltriphenylphosphonium bicarbonate, benzyltrimethylammonium chloride, benzyltrimethylammonium hydroxide, benzyltrimethylammonium tetrahaloborate, tetramethylammonium hydroxide, tetrabutylammonium hydroxide, tetrabutylammonium tetrahaloborate, and mixtures thereof and the like.

Other suitable catalysts include tertiary amines such as, for example, triethylamine, tripropylamine, tributylamine, benzyldimethylamine, imidazoles such as 2-methylimidazole mixtures thereof and the like.

Other suitable catalysts include ammonium compounds such as, for example, triethylamine.HCl complex, triethylamine.HBr complex, triethylamine.HI complex, triethylamine.tetrahaloboric acid complex, tributylamine.HCl complex, tributylamine.HBr complex, tributylamine.HI complex, tributylamine.tetrahaloboric acid complex, N,N'-dimethyl-1,2-diaminoethane.tetrahaloboric acid complex, and mixtures thereof and the like.

Other suitable catalysts include quaternary and tertiary ammonium, phosphonium, and arsonium adducts or complexes with suitable non-nucleophilic acids such as, for example, fluoboric, fluoarsenic, fluoantimonic, fluophosphoric, perchloric, perbromic, periodic, mixtures thereof and the like.

The catalysts are employed in any quantity which will promote the reaction between the phenolic hydroxyl-containing compound and the epoxy-containing compound. Usually, a suitable quantity of catalyst is from about zero to about 0.1, more suitably from about 0.00005 to about 0.05, most suitably from about 0.0001 to about 0.03 moles of catalyst per part by weight of the epoxy-containing component.

In some instances, in order to prevent premature reaction between the epoxy-containing compounds and the aromatic hydroxyl-containing compounds, it may e desirable to include in the composition one or more stabilizers to prevent this premature reaction from taking place. This is especially true when the compositions are to be subjected to prolonged storage at elevated temperatures.

Suitable stabilizers include, for example, organic and inorganic acids, salts and esters of organic and inorganic acids such a, for example, sulfonic acid, fluoboric acid, perchloric acid, boric acid, chloric acid, bromic acid, iodic acid, nitric acid.

Particularly suitable stabilizers include, for example, p-toluene sulfonic acid, benzene sulfonic acid, methyl p-toluene sulfonate, ammonium perchlorate, fluoboric acid, perchloric acid, nitric acid, mixtures thereof and the like.

These stabilizers when employed, are employed in amounts suitably from about 0.05 to about 1, more suitably from about 0.1 to about 0.8 percent by weight based upon the combined weight of the epoxy-containing component.

In the preparation of laminates from the curable compositions of the present invention, the curable compositions are dissolved into one or more solvents and applied to the substrate material from which the prepreg is to be prepared. Suitable such solvents include, for example, aromatic hydrocarbons, ketones, glycol ethers, alcohols, aliphatic hydrocarbon, cyclic ethers, halogenated hydrocarbons, amides, and the like. Particularly suitable solvents include, for example acetone, methyl ethyl ketone, methanol, ethanol, propylene glycol methyl ether, dimethylformamide, any combination thereof and the like. The amount of solvent which is employed is that quantity which provides the laminating varnish or other curable composition with the desired application viscosity. Usually, a amount of solvent is suitably from zero to about 75, more suitably from zero to about 50, most suitably from about zero to about 25 parts of solvent by weight based upon the total weight of the laminating varnish.

Suitable substrate materials include natural and synthetic fibrous materials in filament, mat, woven or the like form. Suitable fibrous materials include, fiberglass, nylon, orlon, cotton, aramid, graphite, boron, cellulose, polyethylene, polypropylene, and the like.

Also, if desired, the curable compositions of the present invention can also contain pigments, dyes, fillers, surfactants, flow modifiers, any combination thereof and the like. Particularly suitable fillers or pigments or flow modifiers include, for example, titanium dioxide, iron oxide, calcium carbonate, quartz, fused silica, silicates, silanes, metal powders such as, for example, aluminum, iron, magnesium, any combination thereof and the like.

The curable compositions of the present invention are particularly useful in the preparation of laminating varnishes for preparing prepreg materials from which electrical laminates can be prepared. One or more plies of the prepreg material are pressed together while being heated in order to prepare a laminate therefrom. One or more layers of an electrically conductive material is employed as an outer layer of the laminate which can be one of the outer layers of the multiply prepreg materials which is pressed together under heat or the electrically conductive outer layer can be applied later by means of an adhesive. Also, if the electrical conductive layer is employed as one of the plies which is pressed together under heat, there can be, if desired, an adhesive layer placed between it and the prepreg material.

Suitable electrically conductive materials which can be employed herein include, for example the electrically conductive metals such as, aluminum, copper, gold, silver, platinum and the like and the electrically conductive organic polymers such as polyacrylonitrile, which have been carbonized and any combination thereof and the like.

The following examples are illustrative of the invention, but are not to be construed as to limiting the scope thereof in any manner.

EXAMPLE 1

A solution is prepared by mixing in a suitable vessel 1200 g (6.64 equiv.) of a diglycidyl ether of bisphenol A having an epoxide equivalent weight (EEW) of 180.8, 2400 g (13.03 equiv.) of a 5 functional phenol-formaldehyde novolac epoxy resin having an EEW of 184.16, 1605 g (5.9 equiv.) of tetrabromobisphenol A wherein the bromine atoms are ortho in relationship to the ether oxygen atoms, 1432.1 g (13.71 equiv.) of a 5.6 functional phenol-formaldehyde novolac resin having a phenolic hydroxyl equivalent weight of 104, 37.08 ml of 35% tetrabutylphosphonium acetate.acetic acid complex in methanol containing a stoichiometric amount of fluoboric acid as a catalyst and 2212.3 g of methyl ethyl ketone (MEK). To this solution is added a sufficient amount of propylene glycol methyl ether to provide a solvent mixture of 66 wt. % MEK and 33 wt. % propylene glycol methyl ether at a solids (non-volatiles) level of 62 wt. %. To this solution is added 0.05 wt. %, based on the solids content, of 2-methyl imidazole. This solution has a stroke cure plate gel time of 146 seconds at 345° F.

This laminating varnish is then applied to 7628/1617 woven glass cloth by pulling the cloth through a resin bath containing the laminating varnish and then up through a doctor bar set at 0.015 in. (0.381 mm) and then through three heating zones of 300° F., 350° F. and 350° F. The total length of the heating zones is 24 feet (731 m). The length of each of the three heated zones is 8 feet (2.43 m). This prepreg is passed through the resin bath and the heating zones at a rate of 9 feet/min. (2.74 m/min.), with a residence time in the heated zones of about 2.5 minutes. The resultant prepreg contains 42 % resin by weight and has a gel time of 68 seconds at 345° F.

Eight plies of this prepreg is then pressed into a laminate having a thickness of 0.060 inches (1.5 mm) by using the following press schedule.

- 10° F./min., room temp to 275° F. (135° C.), 30 psig (206.8 kPa).
- 15° F./min., 275° F. to 350° F. (135° C. to 176.7° C., 30 psig (206.8 kPa) to 500 psig (3447.4 kPa) in 2 minutes; and
- Cool at 500 psig (3447.4 kPa) to 150° F. (65.6° C.) in 6 min.

This laminate has a glass transition temperature, Tg, of 175.9° C. by Differential Scanning Calorimetry (DSC) using a calibrated DuPont instrument model no. 912 with a 1090 controller. Samples are run under a nitrogen atmosphere with a heat up rate of 20° C./minute. After being immersed in boiling water for hours, the sample has a water absorption (pickup) of 0.5% by weight.

EXAMPLE 2

The components of the following formulation, except the catalyst, are mixed at 150° C. until homogeneous. The catalyst is then blended into the blend of resins and curing agents. After the catalyst is blended into the formulation, the resultant catalyzed blend is cured at 177° C. for 1.5 hours. The Tg of the resultant cured product is 158° C.

- 3.8 g (0.021 equiv.) of a diglycidyl ether of bisphenol A having an EEW of 180.8;
- 0.2 g (0.0011 equiv.) of a 5 functional phenol-formaldehyde based epoxy novolac resin having an EEW of 181.8;
- 0.6 g (0.1 equiv.) of tetrabromobisphenol A;
- 2.07 g (0.9 equiv.) of a 5 functional phenol-formaldehyde novolac resin; and
- 0.1 ml of the reaction product of tetrabutyl phosphonium acetate.acetic acid complex and fluoboric acid catalyst.

EXAMPLE 3

The components of the following formulation, except the catalyst, are mixed at 150° C. until homogeneous. The catalyst is then blended into the blend of resins and curing agents. After the catalyst is blended into the formulation, the resultant catalyzed blend is cured at 177° C. for 1.5 hours. The Tg of the resultant cured product is 138° C.

- 3.8 g (0.021 equiv.) of a diglycidyl ether of bisphenol A having an EEW of 181;
- 0.2 g (0.0011 equiv.) of a 5 functional phenol-formaldehyde based epoxy novolac resin having an EEW of 181.8;
- 4.21 g (0.7 equiv.) of tetrabromobisphenol A;
- 0.69 g (0.3 equiv.) of a 5 functional phenol-formaldehyde novolac resin; and
- 0.1 ml of the reaction product of tetrabutyl phosphonium acetate.acetic acid complex and fluoboric acid catalyst.

EXAMPLE 4

The components of the following formulation, except the catalyst, are mixed at 150° C. until homogeneous. The catalyst is then blended into the blend of resins and curing agents. After the catalyst is blended into the formulation, the resultant catalyzed blend is cured at 177° C. for 1.5 hours. The Tg of the resultant cured product is 206° C.

- 0.2 g (0.0011 equiv.) of a diglycidyl ether of bisphenol A having an EEW of 181;
- 3.8 g (0.0208 equiv.) of a 5 functional phenol-formaldehyde based epoxy novolac resin having an EEW of 181.8;
- 0.6 g (0.1 equiv.) of tetrabromobisphenol A;
- 2.05 g (0.9 equiv.) of a 5 functional phenol-formaldehyde novolac resin; and
- 0.1 ml of the reaction product of tetrabutyl phosphonium acetate.acetic acid complex and fluoboric acid catalyst.

EXAMPLE 5

The components of the following formulation, except the catalyst, are mixed at 150° C until homogeneous. The catalyst is then blended into the blend of resins and curing agents. After the catalyst is blended into the formulation, the resultant catalyzed blend is cured at 177° C. for 1.5 hours. The Tg of the resultant cured product is 177° C.

- 0.2 g (0.0011 equiv.) of a diglycidyl ether of bisphenol A having an EEW of 181;
- 3.8 g (0.0208 equiv.) of a 5 functional phenol-formaldehyde based epoxy novolac resin having an EEW of 181.8;
- 4.17 g (0.7 equiv.) of tetrabromobisphenol A;
- 0.68 g (0.93 equiv.) of a 5 functional phenol-formaldehyde novolac resin; and
- 0.1 ml of the reaction product of tetrabutyl phosphonium acetate.acetic acid complex and fluoboric acid catalyst.

What is claimed is:

1. A laminate resulting from curing one or more plies of a substrate material which has been impregnated with a laminating varnish composition comprising a substantially unreacted mixture of (A) an epoxy-containing composition consisting essentially of
   (1) from about 5 to about 95 percent by weight of at least one epoxy resin having an average of not more than 2 vicinal epoxide groups per molecule; and
   (2) from about 95 to about 5 percent by weight of at least one epoxy resin having an average of more than 2 vicinal epoxide groups per molecule represented by the following formulas III or IV or a combination of such resins

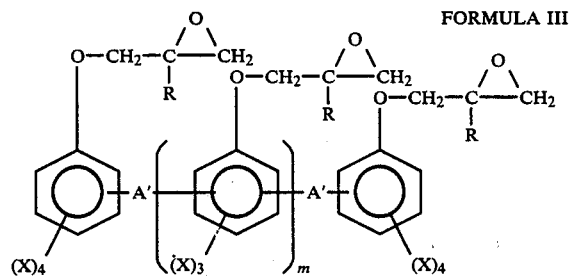

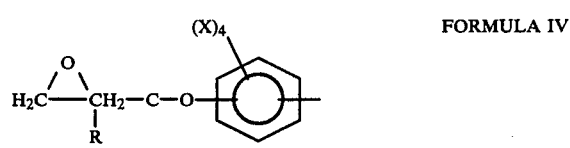

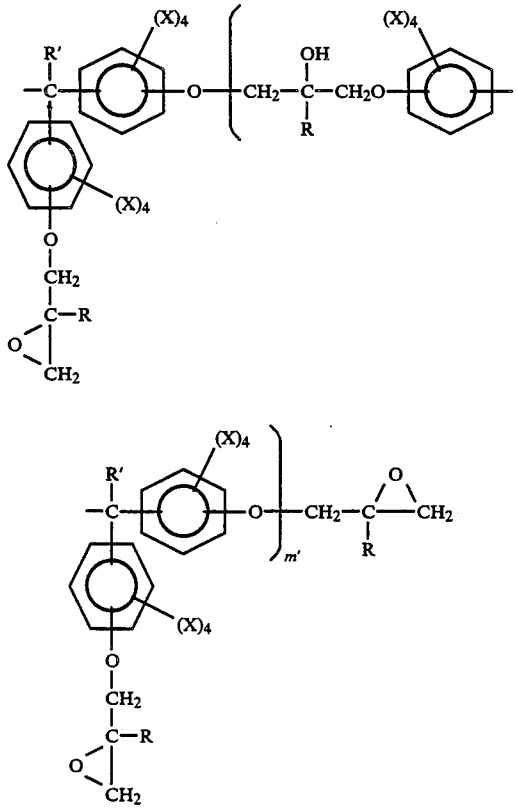

wherein each A' is independently a divalent hydrocarbyl group having from 1 to about 4 carbon atoms; each R is independently hydrogen or an alkyl group having from 1 to about 3 carbon atoms; each R' is independently hydrogen or a hydrocarbyl group having from 1 to about 5 carbon atoms; each X is independently hydrogen, an alkyl group having from 1 to about 10 carbon atoms or a halogen; m has a value from about 1 to about 4; and m' has a value from zero to about 1;

(B) a phenolic hydroxyl-containing composition consisting essentially of
  (1) from about 10 to about 70 equivalent percent of at least one phenolic hydroxyl-containing compound having an average of not more than 2 phenolic hydroxyl groups per molecule; and
  (2) from about 90 to about 30 equivalent percent of at least one phenolic hydroxyl-containing compound having an average of more than 2 phenolic hydroxyl groups per molecule; and
wherein components (A) and (B) are present in quantities which provide a ratio of phenolic hydroxyl groups for each epoxy group of from about 0.75:1 to about 1.2:1;

(C) a catalytic quantity of at least one catalyst for effecting the reaction between components (A) and (B); and optionally (D) one or more solvents in an amount of from zero to about 75 percent by weight of the total composition.

2. A laminate of claim 1 wherein component (A) consists essentially of from about 5 to about 60 weight percent of component (1) and from about 95 to about 40 weight percent of component (2);
  (b) component (B) consisting essentially of from about 10 to about 50 equivalent percent of component (1) and from about 90 to about 50 equivalent percent of component (2); and
  (c) components (A) and (B) are present in quantities which provide a ratio of phenolic hydroxyl groups for each epoxy group from about 0.85:1 to about 1.1:1 and
  (d) component (D) is present in an amount of from zero to about 50 percent by weight of the total composition.

3. A laminate of claim 2 wherein
  (a) Component (A) consists essentially of 5 to about 40 weight percent of component (1) and from about 95 to about 60 weight percent of component (2);
  (b) component (B) consists essentially of from about 10 to about 35 equivalent percent of component (1) and from about 90 to about 65 equivalent percent of component (2); and
  (c) components (A) and (B) are present in quantities which provide a ratio of phenolic hydroxyl groups for each epoxy group from about 0.95:1 to about 1:1 and
  (d) component (D) is present in an amount of from about 0 to about 25 percent by weight of the total composition.

4. A laminate of claim 1, 2 or 3 wherein
  (a) component (A-1) is an epoxy resin represented by the following formulas I or II or a combination of such epoxy resins

FORMULA I

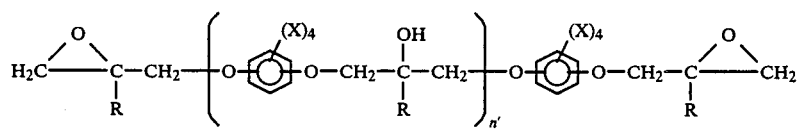

FORMULA II

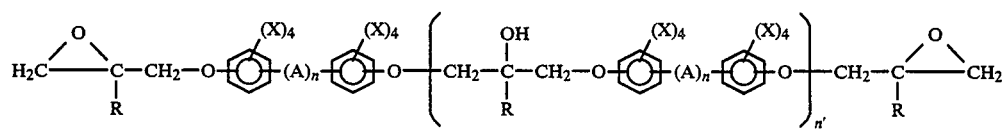

wherein each A is independently a divalent hydrocarbyl group having suitably from 1 to about 5 carbon atoms, —S—, —S—S—, —SO—, —SO$_2$—, —CO—, or —O—; each R is independently hydrogen or an alkyl group having from 1 to about 3 carbon atoms; each X is independently hydrogen, an alkyl group having from 1 to about 5 carbon atoms or a halogen; each n independently has a value of zero or 1; and n, has a value from zero to about 2;

(b) component (B-1) is a phenolic hydroxyl-containing compound represented by the following formulas V or VI or a combination of such phenolic hydroxyl-containing compounds

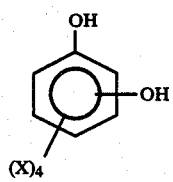

FORMULA V

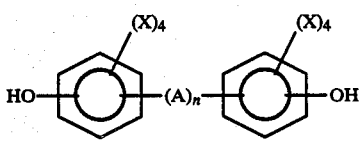

FORMULA VI wherein A, X and n are as previously defined;

(c) component (B-2) is a phenolic hydroxyl-containing compound represented by the following formulas VII or VIII or a combination of such phenolic hydroxyl-containing compounds

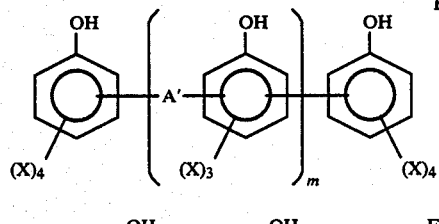

FORMULA VII

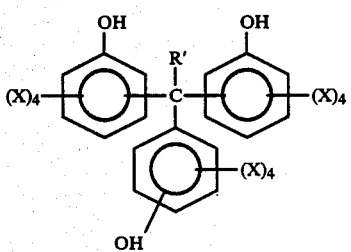

FORMULA VIII wherein each A', R', X and m is as previously defined;

(d) component (C) is a phosphonium compound, an imidazole or a combination thereof; and (e) component (D) is a ketone, a glycol ether or a combination thereof.

5. A laminate of claim 4 wherein
(a) component (A-1) is a diglycidyl ether represented by formula II wherein n has value of 1 and n' has a value from zero to about 0.5;
(b) component (A-2) is a polyglycidyl ether represented by formula III wherein m has a value from about 1 to about 4
(c) component (B-1) is a phenolic hydroxyl-containing compound represented by formula VI wherein n has a value of 1; and
(d) component (B-2) is a phenolic hydroxy-containing compound represented by formula VII wherein m has a value from about 0.1 to about 4.

6. A laminate of claim 5 wherein
(a) component (A-1) is a diglycidyl ether of bisphenol A;
(b) component (A-2) is a polyglycidyl ether of a phenol-formaldehyde novolac epoxy resin;
(c) component (B-1) is bisphenol A or tetrabromo bisphenol A;
(d) component (B-2) is a phenol-formaldehyde novolac resin;
(e) component (C) is quaternary phosphonium acetate.acetic acid complex and fluoboric acid in a respective molar ratio of from about 1:0.9 to about 1:1.25, 2-methylimidazole 2-methylimidazole or a combination thereof; and
(f) component (D), when present, is propylene glycol methyl ether, methyl ethyl ketone, methanol, ethanol, dimethylformamide or a combination thereof.

7. A laminate of claim 1, 2, or 3 which has an outer layer of an electrical conducting material.

8. A laminate of claim 7 wherein the electrical conducting material is copper.

9. A laminate of claim 4 which has an outer layer of an electrical conducting material.

10. A laminate of claim 9 wherein the electrical conducting material is copper.

11. A laminate of claim 5 which has an outer layer of an electrical conducting material.

12. A laminate of claim 11 wherein the electrical conducting material is copper.

13. A laminate of claim 7 which as an outer layer of an electrical conducting material.

14. A laminate of claim 13 wherein the electrical conducting material is copper.

* * * * *